United States Patent [19]

Deffeyes

[11] Patent Number: 4,937,041

[45] Date of Patent: Jun. 26, 1990

[54] STAINLESS STEEL SILVER COMPOSITIONS

[75] Inventor: Robert J. Deffeyes, Arlington, Tex.

[73] Assignee: Carlisle Memory Products Group Incorporated, North Richland Hills, Tex.

[21] Appl. No.: 305,534

[22] Filed: Feb. 2, 1989

Related U.S. Application Data

[63] Continuation of Ser. No. 592,856, Mar. 23, 1984, abandoned.

[51] Int. Cl.$^5$ .............................................. B22F 1/00
[52] U.S. Cl. ...................................... 419/19; 419/23; 75/228; 75/232; 75/246; 75/247
[58] Field of Search ...................... 419/19, 23; 75/228, 75/232, 246, 247

[56] References Cited

U.S. PATENT DOCUMENTS

| | | | |
|---|---|---|---|
| 3,859,087 | 1/1975 | Backstrom | 419/33 |
| 3,988,651 | 4/1976 | Hertz | 317/258 |
| 4,186,244 | 1/1980 | Deffeyes et al. | 428/570 |
| 4,426,356 | 1/1984 | Nair | 419/21 |
| 4,457,780 | 7/1984 | Osada et al. | 75/236 |
| 4,475,983 | 4/1984 | Bader et al. | 75/228 |
| 4,810,289 | 3/1989 | Hoyer et al. | 75/232 |

*Primary Examiner*—Stephen J. Lechert, Jr.
*Assistant Examiner*—Nina Bhat
*Attorney, Agent, or Firm*—Samuels, Gauthier & Stevens

[57] ABSTRACT

Metallization compositions utilizing a (1) relatively refractory flake product, e.g. flake-shaped powder of stainless steel, in combination with (2) a conductive metal such as silver which, upon being fired to melting, is held in the flake type matrix providing an excellent and inexpensive conductor. Termination compounds will comprise ceramic-adhesive frits. Body electrodes will usually comprise organic binders readily removable by thermal oxidation.

12 Claims, No Drawings

STAINLESS STEEL SILVER COMPOSITIONS

This is a continuation of co-pending application Ser. No. 592,856, filed on Mar. 23, 1984, now abandoned.

BACKGROUND OF THE INVENTION

This invention relates to metallization compositions, particularly those useful in heat-processed applications. Such compositions include, for example, those used in manufacture of multi-layer ceramic capacitors as body electrodes or electrode-connecting endterminations.

A great deal of work has been done in manufacturing of coating pastes compositions for immediate or eventual use in metallizing of ceramic surfaces. Among those more demanding applications are those encountered in the manufacture of multilayer ceramic capacitors which have thin electroconductive-metal body electrodes and end-terminations whereby a plurality of such electrodes are connected electrically into a single electrical terminal for appropriate connection into an electrical circuit. Such compositions are generally characterized by a reliance on the properties of expensive noble metal constituents.

It has been a general objective of much of the prior work to achieve electrodes having a superior combination of cost and performance. Often the work is directed to providing thin electrodes which are characterized by improved performance characteristics. Such systems are discussed in such references as U.S. Pat. No. 4,426,356 to Nair wherein up to about thirty percent of an inorganic powder is incorporated with finely-divided noble metal powders, into a metallizing paste for use in making capacitors. Numbers of other patents disclose the use of relatively inexpensive powders, particularly nickel powder, in combination with a noble metal in such pastes. See, for example, U.S. Pat. Nos. 3,872,360 and 3,988,651. Other patents which relate to the general area of interest include U.S. Pat. Nos. 4,055,850; 4,075,081 and 3,237,066; and 3,824,127. Still another attempt to improve electrode economics is described in U.S. Pat. No. 3,679,950 which discloses the use of a so-called "fugitive electrode process". Despite such work, it has continued to be a problem to optimize the performance and economics of such metallizing solutions. The chemical stability and/or electroconductive characteristics of the newer products tend to be so inferior to the conventionally-used noble metals that the resultant cost savings does not justify use of the newer products in many applications.

Definitions as used in this application

Refractory powder—a non-noble metal material which remains in its solid phase at a temperature well above the temperature at which useful noble metals like palladium, silver and gold or combinations thereof will liquify. Temperatures of interest are above 600° C., usually much higher.

Noble metal—any noble metal, or alloy or mixture thereof.

Termination

Composition—an electroconductive composition, it contains an adhesion promoter, usually glass frit, as known in the art, to readily adhere to a ceramic substrate upon firing of the composition. Favored terminations are solderable, but it is also possible to cover a termination with a composition which contributes essential solderability.

Body Electrode—one of the electroconductive layers which extends between two dielectric layers within the body of a multilayer electrode. It is usually connected to a terminal which has been formed by use of a termination composition.

Liquid Vehicle—any liquid which forms part of a composition and enables the mechanical coating or spraying of the composition onto a surface to be coated. The vehicles can be organic "solvents" liquified resins or the like.

SUMMARY OF THE INVENTION

It is one important object of this invention to provide new compositions and processes utilizing these compositions which allow substantial improvement in the economics of making multi-layer ceramic capacitors.

Another object of the invention is to provide novel means to improve the efficiency of nobel metals in providing conductive in electrically-conductive compositions.

Another object of the invention is to provide novel end termination compositions useful in ceramic capacitors.

Another object of the invention is to provide novel body electrode compositions for use in ceramic capacitors.

Still another object of the invention is to provide a novel ceramic capacitor.

All of the above objects are based, at least in part, on the achievement of providing a novel group of metallizing compositions, the attainment of which is a principal object of the invention.

The above objects have been substantially achieved by the use of a major portion of an refractory inorganic stabilizing powder filler, which is advantageously, but not always necessarily, flake-shaped in the composition which serves, on melting of the noble metal, to anchor the noble metal in place.

In some preferred embodiments of the invention, the refractory powder is a flake such as stainless steel which not only stabilizes the noble metal against excessive flow; but, as it starts to melt, channels any movement into preferred linear, flake-emulating paths between the refractory flakes. This action appears to contribute to the electroconductive efficiency of the relatively small amount of noble metal present. In some embodiments of the invention, the conductivity of the composition will increase many fold as the melting takes place, then drop if the time/temperature profile is unduly prolonged.

In general, it is preferred that the noble metal be so selected that it changes phase rather close to the maximum processing temperature of the step in which it is fired This suggestion is made at least in part, to maintain a time/temperature profile which will not result in excessive flow activity by the noble metal. Therefore, it is to be understood that higher transient or localized temperatures may be tolerated if the time/temperature profile of the heated material and the material adjacent thereto are not such as to promote or allow the undesired flow of metal noble metal. Very -small-particle-sized noble metal is also helpful in avoiding excessive flow between refractory particles. This is because of superior initial placement relative to the flake in a coating and, in some applications, because of the more rapid heat transfer to the center of a small particle. Small particles can be melted more readily by external heat without the external portions of the particles being overheated.

Very small particles, sub-micron particles, preferably, in the range of about 0.05 to 0.3 microns in average diameter, are convenient for use in the compositions and process of the invention. Particles below about 0.1 micron are preferred. Especially favorable small particles may be formed according to the processes disclosed in U.S. Pat. Nos. 4,251,275 and 4,186,244.

Among the preferred noble metals are silver and silver-palladium in ratios ranging from 80-to-20 to 20-to-80 of silver to palladium. These can be in the form of an alloy or a physical mixture A preferred refractory material is stainless-steel flake. The stainless steel advantageously is cleaned chemically before use. One useful powder is a nominally type 316 stainless powder available form Novamet. It is called "W grade 316L". The flake appears to be magnetic in its small particle-form, a factor that can be used in forming a dense "layered" coating before any hightemperature treatment. The flake is several microns in average diameter, but the average thickness is, and should be, below one micron. The flakes are electroconductive. As measured in bulk powder form, resistivities of about 0.2 ohms per square are typical. Type 311 stainless flake is another example of a stainless steel, the flake of which could be used in the invention.

In general a variety of compositions, each intended for a different use can be achieved by the practice of the invention.

The particular properties of the noble metal powder are best selected with particular attention to the thermal processing to be encountered in the contemplated processing. Thus, for example, it is preferred that powders which melt at 900° C. be utilized where the maximum temperature will be about 950° C., that powders that melt at closer 1100° C. be used where the maximum temperature to be encountered is 1150° C., and so forth.

Choice of powders which, on melting, better wet the flake is also to be encouraged. Thus quantities of iron and nickel in a silver alloy powder can help enhance the wetting of a refractory flake such as stainless steel and thereby broaden somewhat time/temperature profile of optimal, or near-optimal, performance of the compositions.

These small-particle and alloy powders can be manufactured in any numbers of ways known to the art, however one way which assures excellent product uniformity in terms of particle-size distribution and stoichiometric composition of particles is the oxalate decomposition-type processes disclosed in U.S. Pat. Nos. 4,251,275 and 4,186,244 and 3,965,046.

In general, it is desired that the termination compositions be able to withstand firing at temperatures as high as 600° C. event to 800° C. in some situations. Such a material is desirably solderable, although, alternately, may be overcoated with a solderable composition if desired.

In this application, there is shown and described a preferred embodiment of the invention and suggested various alternatives and modifications thereof; but it is to be understood that these are not intended to be exhaustive, and that other changes and modifications can be made within the scope of the invention. These suggestions herein are selected and included for the purposes of illustration in order that others skilled in the art will more fully understand the invention and the principles thereof and will be able to modify it and embody it in a variety of forms, each as may be best suited to the condition of a particular case.

EXAMPLE 1

A body electrode composition was prepared using the following compositions:

|  | Parts by weight |
| --- | --- |
| stainless steel flake* | 7 |
| silver powder** | 3 |
| acrylic resin*** | 1 |
| n-butyl acetate | 11 |

*The stainless steel flake was the type 316 flake obtained from Novamet and described above in this specification. It has a thickness well below one micron in diameter.
**The silver powder was that product as described in U.S. Pat. No. 4,251,275 to Deffeyes and Armstrong. This powder has a very small quantity of an organo group on the surface thereof and is about 0.2 microns in average diameter.
***The acrylic resin was that supplied by Rohm and Haas under the tradename Acryloid A-21 in a 30% solution. The weight is given above is that of the solution, not the dry weight.

The material was heated to 900° C. and had excellent conductivity. When the heat was increased to 1000° C., conductivity was good for at least about 10 minutes.

EXAMPLE 2

Example 1 was repeated except that the body electrode composition was modified by adding 1.1 gram of sub-micron palladium powder thereto (The palladium powder had been prepared by chemical reduction means)

The material could be fired for very long periods at 1000° C. with no substantial loss of conductivity, thereby indicating the value of adding to the silver quantities of palladium to improve the high temperature characteristics of the composition.

EXAMPLE 3

The composition of Example 1 was modified by including therein a small quantity of glass frit powder ( a sub-micron adhesion-promoting powder melting about 450° C.). This material is readily applied to the electrode-exposing sides of a semi-finished ceramic capacitor and adheres thereto to form a termination when fired above 450° C. The termination was readily solderable into a circuit at about 200° C. even without the use of a flux.

EXAMPLE 4

Other refractory flakes (such as those nickel-based or cobalt-bearing alloys sold under the trade designations Hastelloy, Stellite and the like), when substituted in the formulations of either claim 2 and 3 provide excellent electroconductive body electrode compositions and termination compositions.

EXAMPLE 5

Example 2 is repeated using ultra-small mica flakes as the flake component. The weight ratio of silver/flake is also raised to 50/50. A suitably electroconductive coating is produced. The evitability of mica and metal is improved by adding an effective quantity of glass frit or non-glass adhesion promoter to the composition.

It has been convenient to discuss the various parameters in terms of weight percentages. In fact, the dominant factor in conductivity is volume of the various ingredients and the interaction caused by shape and arrangement. Suitable to achieve the proper volume relationship are readily carried out by any compounding technician. Particularly surprising in the process of the invention is the fact that such good conductivity of the compositions can be obtained when one uses very small volumes of noble metal based on the total metal present. These amounts typically range about from 25 to 40% by volume of noble metal.

It will be noted from the above examples that electroconductive flakes are preferred. However, since an important function of the flake appears to relate to its shaping effect on the noble metal components, non-electroconductive, indeed even non-metallic flakes such as very small mica flakes can also be used in the product of the invention. Indeed; all mixtures of mica and metal flakes with sub-micron thicknesses can be used with the noble metal powders.

Also, it is not strictly necessary that the "flake" have very low thickness/average diameter ratios. What is desirable is that they are so shaped that they tend to or can be, caused to lie flat when applied as a coating. Sub-micron thicknesses are desirable in capacitor compositions.

Also, it should be noted that in some applications, particularly end terminations, the need for a flake-induced arrangement is reduced. Therefore it should be noted that 60/40 weight ratios of micron-sized 311 stainless powder and silver (or silver palladium) mixes offer a novel and economic electroconductive composition not heretofore part of the prior art. In such compositions, even less emphasis need be placed upon the ready availability of the two metals because the stainless steel has substantially larger surface area and acts to form mechanical matrix with no flake-shape molding utility.

EXAMPLE 6

Example 1 is repeated except that the stainless steel is powder is decreased to 6 parts and is used in the form of 1.5-micron powder which is not flake-shaped but has an average particle configuration similar to common metal particles. However the powder material is best screened so that the powder is in the range of 1–2 microns. Sufficient additional binder is also added to make the material readily coated.

Although the flake-shaping aspect of the invention is lacking, sufficient wetting is achieved on melting to noble metal into the matrix of stainless steel powders to provide excellent electroconductivity and chemical stability with extremely favorable economics.

EXAMPLES 7–8

Example 7 is repeated using 20:80 and 30:70 ratio of palladium powder to nickel powder. An excellent material having excellent high-temp firing properties is obtained.

It is also to be understood that the following claims are intended to cover all of the generic and specific features of the invention herein described and all statements of the scope of the invention which might be said to fall therebetween.

What is claimed is:

1. 1. A process for forming a metallization layer which includes:
   providing larger particles of a refractory electroconductive metal;
   positioning a particulate noble metal of smaller particle size between the larger metal particles to provide a mixture of large metal particles and small noble metal particles;
   heating the mixture to a temperature sufficient to effect melting and flow of the noble metal particles, said temperature below the melting point of the larger metal particles such that the larger metal particles do not melt;
   flowing the noble metal along and between the surfaces of the relatively larger metal particles while maintaining the temperature below the melting point of the larger particles; and
   cooling the mixture wherein the noble metal is repositioned between the larger metal particles.

2. A process as defined in claim 1 wherein the noble metal particles are less than 0.3 microns in average diameter and the larger metal particles are more than 1 micron in average diameter.

3. The process of claim 1 wherein the noble metal particles have an average diameter below about 0.5 microns and the larger particles have a diameter in excess of at least 3 microns.

4. The method of claim 1 wherein the larger metal particles are flakes.

5. A process as defined in claim 1 wherein the larger metal particles are stainless steel.

6. The process of claim 1 wherein the larger metal particles are corrosion-resistant nickel alloy flake particles.

7. The process of claim 1 wherein the refractory larger metal particles are corrosion-resistant nickel flake particles.

8. A process as defined in claim 1 wherein the noble metal particles comprises about 25% to 40% by volume of metal in the layer.

9. The process of claim 1 wherein the noble metal particles are silver or silver-platinum.

10. The process of claim 1 wherein the smaller noble particles comprise silver and palladium in ratios ranging from 80:20 to 20:80 of silver to palladium.

11. A process as defined in claims 1, 5, 6, 7 or 9 wherein the noble metal particles comprise an effective quantity of the metal from which the larger metal particles are formed to enhance wetting of the larger metal particles by the noble metal.

12. The process of claims 1, 5, 6, 7 or 9 which includes:
   adding a glass frit to said layer in an effective amount to enhance the adherence of said layer to a ceramic substrate.

* * * * *